(12) United States Patent
Spare et al.

(10) Patent No.: US 8,039,360 B2
(45) Date of Patent: Oct. 18, 2011

(54) METHOD OF ASSEMBLING INTEGRATED CIRCUIT COMPONENTS

(75) Inventors: Bradley Spare, Oceanside, CA (US); Michael D. Hillman, Los Altos, CA (US); Gregory Tice, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/241,933

(22) Filed: Sep. 30, 2008

(65) Prior Publication Data

US 2010/0081229 A1  Apr. 1, 2010

(51) Int. Cl.
*H01L 21/30* (2006.01)

(52) U.S. Cl. ........ 438/455; 438/458; 438/460; 438/462; 438/463; 257/E21.003; 257/E21.087

(58) Field of Classification Search .................. 438/455, 438/458, 459, 460, 462, 463, 464
See application file for complete search history.

(56) References Cited

U.S. PATENT DOCUMENTS

| 5,848,080 | A * | 12/1998 | Dahm | 372/25 |
|---|---|---|---|---|
| 6,676,878 | B2 * | 1/2004 | O'Brien et al. | 264/400 |
| 7,354,802 | B1 * | 4/2008 | Poddar et al. | 438/113 |
| 7,432,596 | B1 * | 10/2008 | Bone | 257/747 |
| 2002/0027257 | A1 * | 3/2002 | Kinsman et al. | 257/400 |
| 2002/0098619 | A1 * | 7/2002 | Ahn et al. | 438/107 |
| 2007/0048902 | A1 * | 3/2007 | Hiatt et al. | 438/108 |
| 2008/0318395 | A1 * | 12/2008 | Farnworth et al. | 438/462 |

* cited by examiner

*Primary Examiner* — Hsien Ming Lee
(74) *Attorney, Agent, or Firm* — Schwegman, Lundberg & Woessner, P.A.

(57) ABSTRACT

The disclosure identified as methods of mounting integrated circuits, including solar cells, to a substrate wherein the circuits are mounted prior to being singulated into discrete die. Once the semiconductor die sites or other circuits are formed on a wafer, the wafer will be attached, either whole, or divided into one or more multi-die site wafer segments, to a substrate. This attachment may be by conventional surface mount technology, for example. After such mounting, the individual die sites on the wafer segments will be singulated to form discrete die already mounted to the supporting substrate. The singulation may be preferably performed by laser dicing of the wafer segments.

12 Claims, 2 Drawing Sheets

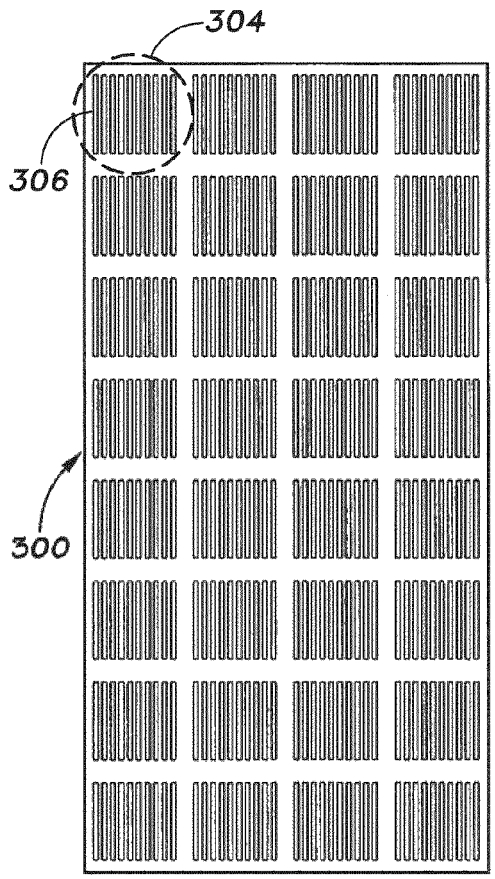
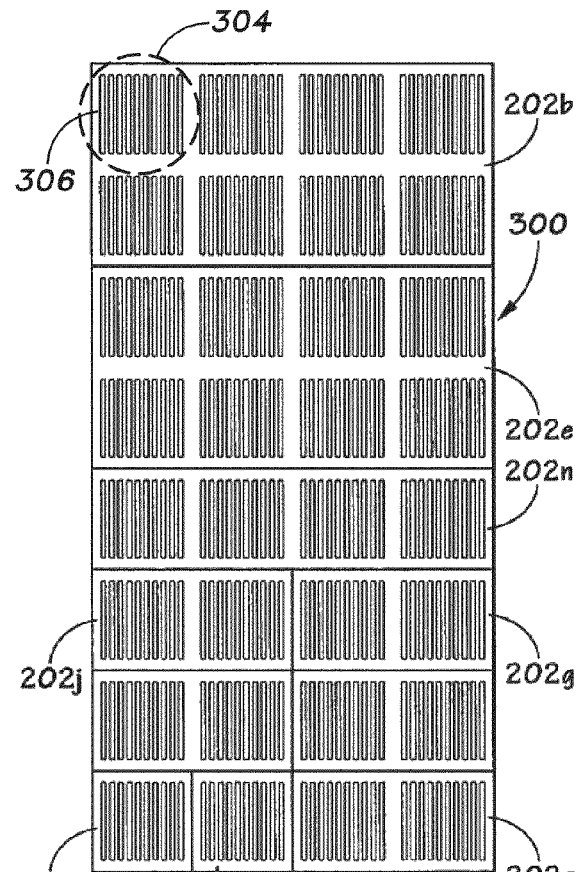
FIG. 3    FIG. 4
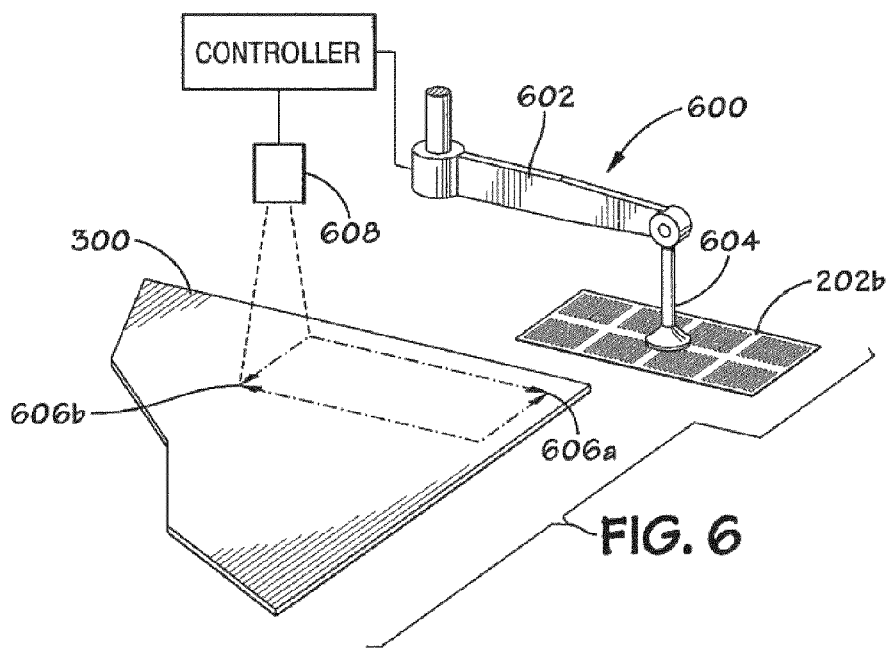
FIG. 6

METHOD OF ASSEMBLING INTEGRATED CIRCUIT COMPONENTS

BACKGROUND OF THE INVENTION

The present invention relates generally to methods and apparatus for assembling integrated circuit components to substrates; and more specifically relates to improved methods and apparatus for singulating semiconductor devices after mounting to a substrate. Along with uses with other types of semiconductor devices, the present invention provides particular advantages with respect to the assembly of components including solar cells, such as in the forming of solar arrays.

The present invention will be described herein in the context of semiconductor devices. Semiconductor devices are typically formed using a semiconductor material wafer, such as a monocrystalline silicon wafer or a gallium arsenide wafer, with additional layers and structures then formed on the wafer. However, the use of such a semiconductor material substrate as a starting point is not essential, as conventional techniques allow the use of other substrates, such as quartz, with an appropriate semiconductor material grown or otherwise formed on or bonded to such substrate. In all cases, the resulting devices would be "semiconductor devices," as discussed herein.

Using the example of semiconductor die which include photo-voltaic cells, commonly referred to as "solar cells," many if not most applications of solar cells require the use of multiple such cells in order to form a useful assembly, such as a solar panel. Such solar panels may range from relatively small, such as only a few square inches, as might be used to provide power to a portable, consumer-type device, to very large solar panels, several square feet in size, as might be used, for example, either alone or with a number of comparable panels, such as in a rooftop installation on a building.

Additionally, as is well-known in the art, regardless of the ultimate size of the solar panel, individual solar cells are not susceptible to being significantly scaled in size, and thus are typically relatively small structures, often having an area on the order of approximately 1.5 to 8 sq. mm. For example, a conventional, individual solar cell, typically a simple photodiode, can produce somewhere between approximately 0.35 and 0.8V, with some more complex, very high efficiency cells generating up to approximately 2.5V, depending upon the materials and construction used in the cell. However, to produce adequate voltages and currents for most end purposes, multiple solar cells must be used in combination, and each solar cell must be electrically isolated from other solar cells. For example, if there is electrical communication between solar cells, such as electron migration through a common substrate, the diode properties of each solar cell will be compromised, leading to loss of efficiency in the cell, if not failure of the solar cell. Some attempts to achieve this isolation involve doping of the semiconductor substrate to establish diffusion barriers, or neutral zones, within the substrate and between the solar cells. While such steps can be reasonably effective, they also significantly increase the difficulty of processing the wafers, as it can be difficult to establish the isolation regions without impairing the semiconductor properties of the adjacent regions in the substrate. Additionally, such diffusion operations increase the time and complexity, and thus cost, of manufacture of the solar cells.

Because of the difficulties of such processing, the more common strategy is to physically singulate each of the solar cells from the wafer in which they were processed. Each singulated solar cell is then individually removed from the remainder of the diced wafer, and individually placed, such as through use of a placement device known in the industry as "pick and place" equipment, on a supporting substrate. While such processes are generally satisfactory in terms of the performance of the resulting device, the processes are relatively inefficient, requiring individual movement of each individual cell, and the separate alignment of each such cell with the supporting substrate. Since it is not uncommon for even a relatively small solar panel assembly to include tens, if not hundreds of discrete solar cells, the process can be undesirably time-consuming, and therefore costly.

Accordingly, the present invention provides a new method of assembling semiconductor device components, including but not limited to solar cells, to a supporting substrate; with such methods providing efficiencies not present in prior art methods.

SUMMARY OF THE INVENTION

The techniques described and illustrated herein offer efficiencies in the handling of semiconductor wafers and the devices formed thereon. In accordance with the present disclosure, semiconductor wafers will be handled and mounted to a substrate either as complete wafers, or as one or more wafer segments comprising multiple die sites. Once the wafer segments are mounted to a substrate, at least one of the die sites will be physically isolated from each adjacent die site of that wafer segment. In some preferred examples of the inventive techniques, the wafer segments will be mounted to the substrate through use of solder reflow surface mount techniques.

In some examples of the invention, manual handling and placement of the wafer segments on the substrate may be used. However, in many applications, it will be preferable to utilize conventional semiconductor handling equipment, such as that previously used for handling discrete die, to place the wafer segments relative to the substrate.

In some preferred examples of the techniques described herein, the die sites of the wafer segments will be singulated relative to the remainder of the segment through use of laser cutting mechanisms. Such laser cutting mechanisms will be selected and controlled to allow cutting through the wafer segment while causing minimal disturbance to the surface of the underlying substrate.

BRIEF DESCRIPTION OF THE DRAWINGS

FIG. 3 depicts, from an upper plan view, an example substrate upon which semiconductor die will be mounted.

FIG. 4 depicts the substrate of FIG. 3 having the outlines of wafer segments as identified in FIG. 2 overlaid thereon to depict the placement of such wafer segments on the substrate.

FIG. 6 depicts, again in schematic representation, an apparatus placing a wafer segment as depicted in FIG. 4.

DETAILED DESCRIPTION OF PREFERRED EMBODIMENTS

The following detailed description refers to the accompanying drawings that depict various details of embodiments selected to show, by example, how the present invention may be practiced. The discussion herein addresses various examples of the inventive subject matter at least partially in reference to these drawings and describes the depicted embodiments in sufficient detail to enable those skilled in the art to practice the invention. However, many other embodiments may be utilized for practicing the inventive subject matter, and many structural and operational changes in addition to those alternatives specifically discussed herein may be made without departing from the scope of the invented subject matter.

Figure 1:
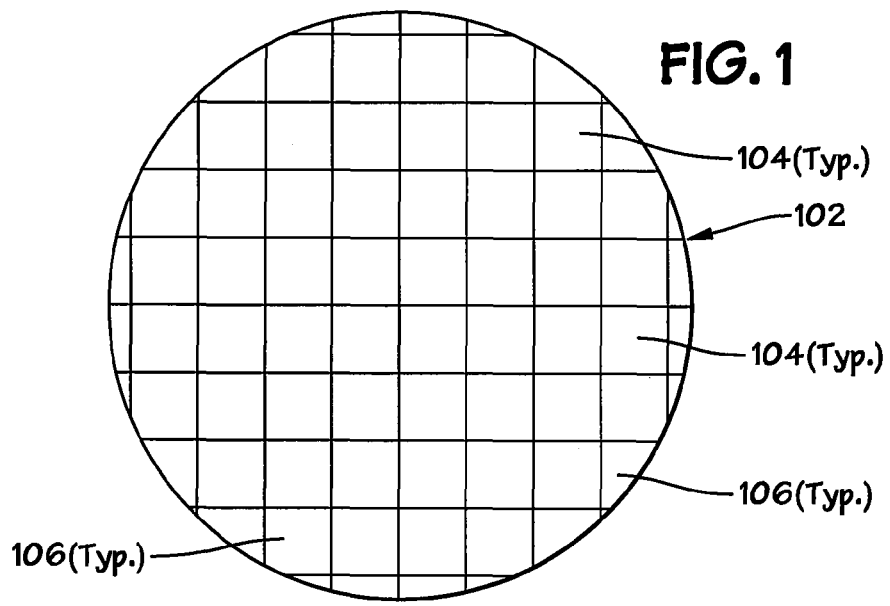
FIG. 1 depicts, in simplified representation, a conventional semiconductor wafer having a plurality of individual die sites.

Referring now to the drawings in more detail, and particularly to FIG. 1, therein is depicted an example semiconductor wafer 102 having a plurality of individual die sites 104 represented thereon, each such die site 104 representing a solar cell. For purposes of the present explanation, the example of individual semiconductor die sites formed as solar cells will be utilized, although the present invention is applicable to virtually any other type of semiconductor device wherein it is considered useful to simultaneously place multiple such devices on a single substrate or other receiving surface.

As is well known in the industry, a semiconductor wafer 102 is typically processed to produce a maximum number of identical semiconductor die. Each such die (or "die site" while still in wafer form) is separated from adjacent die sites by spaces, or "streets." These "streets" represent the spaces provided for singulation of the individual die, since any type of a cutting operation to achieve that singulation will result in a loss of material from the wafer where the cut is made.

In conventional semiconductor manufacturing, singulation of the individual die will be performed on the complete wafer. In such conventional processing, however, various processes may be performed on the wafer subsequent to fabrication but prior to die singulation. For example, the wafer may be subjected to a functional testing, or "probe testing," to determine basic functionality of the individual die on the wafer. Additionally, the wafer may be subjected to wafer-level burn in testing, where electrical signals are applied to the individual die sites, and the wafer is often also subjected to external heat to subject the wafer to stresses designed to accelerate failure, or to otherwise indicate individual die sites unlikely to be suitable for long-term use for their intended purpose. Once all such operations intended to be performed at the wafer level are finished, the wafer will be cut to singulate each die site into a discrete device, or die. To separate the die, typically a supporting member, such as a thin film having a tacky surface, will be attached to the backside (the original starting substrate side) of the wafer. This supporting film is intended to support and retain the individual die sites in their respective placements during the singulation process, and during limited transportation thereafter; and to also allow relatively easy removal of each individual die for placement on another surface. In some cases, the other surface may be a tray or other container for shipment.

In accordance with the inventive process, once the wafer has been processed to the extent desired, as described above, the wafer may be further processed to facilitate efficient placing of the individual die in an operative configuration on a substrate. For the example used herein, the substrate will be described as a printed circuit board (PCB), as is well known for supporting integrated circuits and other electronic components, and for providing the desired electrical connections to such devices. Other types of supporting substrates include other semiconductor wafers or portions thereof used for interconnecting die; substrates used to support multiple components, such as in multi-chip packages; and various support structures used to facilitate interconnection of components while supporting the components in some operative orientation.

Figure 2:
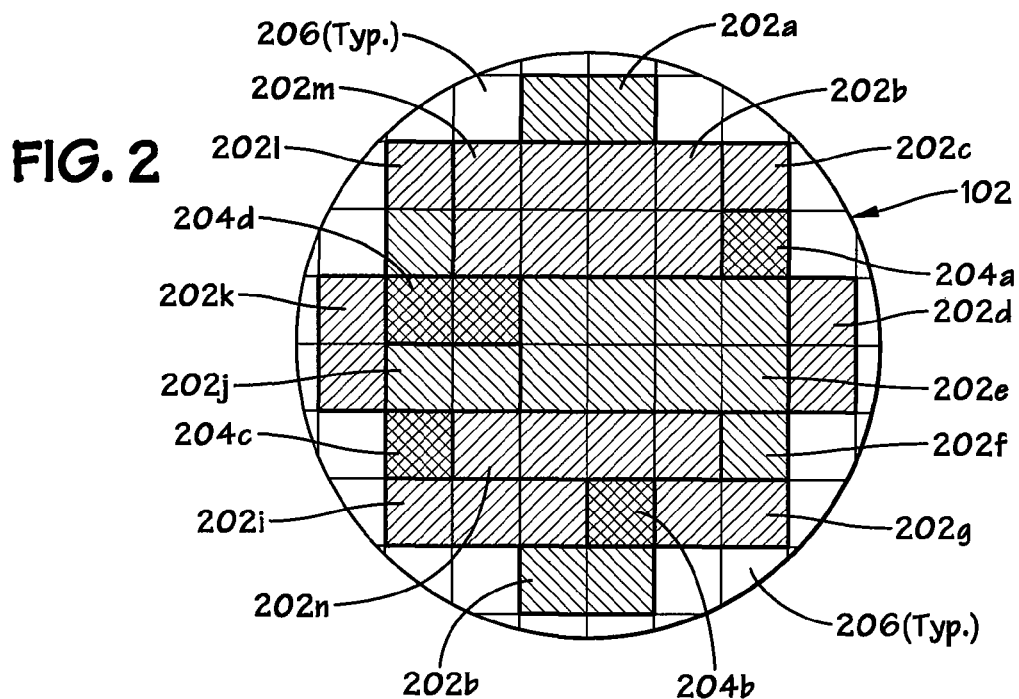
FIG. 2 depicts the wafer of FIG. 1 having a plurality of wafer segments identified thereon, with each wafer segment including one or more die sites.

Referring now to FIG. 2, therein is depicted the wafer 102 of FIG. 1 with a plurality of wafer segments 202a-m, each including one or more individual die sites, and each identified by a combination of common crosshatching and bolded boundaries. Also identified in FIG. 2 are four wafer segments 204a-d, indicated by cross-hatched lines. These wafer segments 204a-d represent wafer segments having die sites determined to be defective, and thus not suitable for use. The determination of the optimal configuration for these wafer segments can be on a number of bases, depending upon the specific application. For example, as will be discussed below, wafer segments 202a-m will be mounted on a substrate having a width intended to accommodate four solar cell die across. Accordingly, wafer 102 has been divided into wafer segments 202a-m, having a maximum width of four die sites. As will be apparent from FIG. 2, in this example the wafer segments have also been defined to exclude defective die sites 204a-d. As will be apparent to those skilled in the art, the example division of wafer 102 into the identified wafer segments 202a-m, 204a-d is merely one example presented here to illustrate this aspect of the invention; but any other desired subdivision of wafer 102 into one or more wafer segments that include multiple die sites could be used. For example, it will be seen that there are contiguous groups of operable die sites that could be grouped into a single wafer segment that is larger than even the largest depicted wafer segments 202b, 202e, 202m, 202n identified in this example. While the segmenting of a semiconductor wafer 102 into units larger than individual die is not believed to have been previously known, the techniques for evaluating a semiconductor wafer 102 to determine which die sites are operable and may thus be used, and to then create a map of the wafer to indicate the useful die sites is known. These known techniques may be applied, with appropriate adaptation based on the teachings herein, to facilitate automated identification of wafer segments in accordance with such a wafer map and defined variables for the desired parameters for identifying appropriate wafer segments. Of course, as an alternative, the wafer segments to be formed may be determined manually. Further, a wafer segment may include an entire wafer, potentially with or without the removal of incomplete die sites 206 and/or defective die sites 204. Thus, the techniques described and illustrated herein may be utilized to take any desired size or configuration of wafer segment, including a whole or substantially whole wafer, to mount on a substrate.

Once the desired wafer segments are defined, the wafer will be cut in the manner described earlier herein to define those respective wafer segments. This cutting may be by any desired method, such as mechanical wafer saws, and the like. However, because the present invention benefits, as will be discussed below, from the narrowness of cut that is obtainable through laser cutting, maximum benefits may be obtained if laser cutting of wafer 102 is used to define the selected wafer segments.

Referring now to FIG. 3, therein is depicted an example of a mounting surface of a substrate, such as a printed circuit board 300, having a plurality of mounting sites 304, thereon. As noted previously, the substrate may be virtually any desired surface as may be used to physically support, and to provide electrical connection with, semiconductor die, such as the discussed solar cells. In this example of solar cells, the cells require a relatively small number of separate electrical contacts relative to other types of integrated circuits. Accordingly, each mounting site 304 includes a plurality of contact strips, indicated generally at 306. Each contact strip 306 will provide a single circuit contact to a solar cell die site. The contact surface of each die site 104 on wafer 102 will preferably have a corresponding plurality of contact strips (not illustrated) configured to be placed in registration with contact strips 306. Each contact strip will be connected, through vias or other conductive structures, with conductive traces on the back surface of, or internal to, printed circuit board 300. Such conductive traces allow the establishing of appropriate signal paths and interconnections between additional components and each solar cell mounted on printed circuit board 300. While conductive strips such as those illustrated are suitable for devices requiring a relatively small number of discrete contacts, some integrated circuits will need many more contacts, and thus may have a much more complex configuration of solder pads on the contact surface. The formations and structures of such solder pads are well known to those skilled in the art.

Referring now to FIG. 4, therein is depicted printed circuit board 300 with the outlines of a plurality of wafer segments 202, as previously identified on wafer 102, overlaid thereon. For sake of clarity of this description, the contact strips 306 of each mounting site 304 are depicted. However, in reality, such contact strips would not be visible if the identified wafer segments were placed on the surface of printed circuit board 300, and all that would be seen from a top, plan, view would be the upper surface, or backside, of each wafer segment. In this example, wafer segments 202*b*, 202*e*, 202*a*, 202*g*, 202*j*, 202*a*, 202*c* and 202*f* have been placed on printed circuit board 300.

Referring now also to FIG. 6, therein is depicted a portion 600 of a placement device, such as a conventional die placement device, conventionally known as a "pick and place" machine, in process of performing its function, as adapted for purposes of the present invention. For example, such a placement device typically includes an arm, as depicted at 602, with a contact head 604 coupled thereto. Contact head 604 typically includes a lifting mechanism such as a vacuum port and a sealing member (not illustrated) that enable the establishing of a vacuum through contact head 604 when the contact head engages a die, to enable the lifting of the die. After lifting of the die, it can be moved, through control of arm 602, to another desired location. As can be seen in FIG. 4, the placement equipment here is used to engage and move an entire wafer segment 202*b*, rather than a single die.

Such placement equipment typically includes, or is otherwise operatively associated with, a vision system 608 that may be used to align an individual die with a mounting location. Many such alignment systems are well known in the art for use with a placement device. For example, systems are known which provide a desired registration between specific features on the die, such as contact pads with corresponding features on the substrate. Accordingly, in some cases registration marks, or fiducials, 606*a*, 606*b* formed on one or both of the printed circuit board and the die are used to establish the desired registration. The vision system will provide data regarding the relative positioning of the two components that will be processed by the placement equipment to bring those components into the desired registration with one another. Each wafer segment 202*b*, 202*e*, 202*a*, 202*g*, 202*j*, 202*a*, 202*c* and 202*f* depicted in FIG. 4 will typically be placed in the indicated placement through use of such a placement device.

One advantage of the system of this example is that the separate motions required of the placement device to fully populate all mounting sites of printed circuit board 300 are significantly reduced relative to conventional technology, wherein each mounting site would be populated with a discrete solar cell die. Thus, for the example printed circuit board 300 of FIGS. 3 and 4, which includes only thirty two mounting sites 304, using conventional techniques, thirty two separate moves and individual placements of die would be required to populate the board. However, as is apparent from FIG. 4, through use of the presently described techniques only ten such moves are required to fully populate printed circuit board 300 with wafer segments 202*b*, 202*e*, 202*a*, 202*g*, 202*j*, 202*a*, 202*c* and 202*f*.

Once the wafer segments 202*b*, 202*e*, 202*a*, 202*g*, 202*j*, 202*a*, 202*c* and 202*f* are in place, they will be mounted to printed circuit board 300 through use of conventional surface mount technology. As one example of such surface mount technology, each of the described contact strips (not illustrated) on each semiconductor die will have a plurality of solder balls arranged and attached thereto (see FIG. 5A). In another example of such surface mount technology, a layer of solder paste will be applied, typically through use of a stencil, to the solder pads on one of the two component; most commonly on the substrate that will receive the wafer segment. The solder paste includes both flux and solder, and is compounded to have a texture to assist in holding the two components in their placed orientation with one another.

With either method for applying the solder, the printed circuit board, with each of the identified wafer segments, will be subjected to heat sufficient to cause the solder to reflow and to thereby establish an essentially permanent mechanical and electrical connection between each die site in each wafer segment and a respective die site 304 on printed circuit board 300. There are a number of mechanisms to supply the necessary heat, with the simplest and most common being a convection oven. Other systems however, use infrared lamps or circulation of heated gases. In some systems, heated inert gases are circulated within a convection curing oven.

Figure 5:
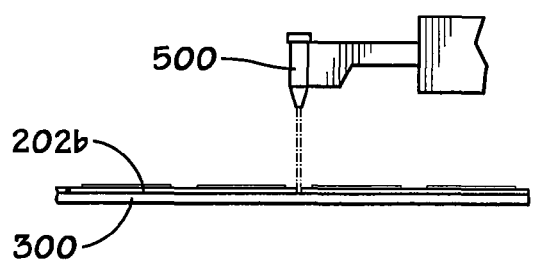
FIG. 5 depicts, in schematic representation, the dicing of an example wafer segment from the assembly of FIG. 4; depicted in FIG. 5A in expanded vertical section.
Figure 5A:
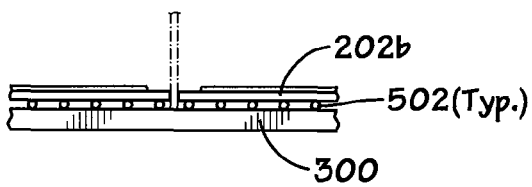

As noted previously, each solar cell die must be electrically isolated from other cells, and this is preferably accomplished by physical separation. In the depicted example only the die on wafer segments 202*c* and 202*f* are physically isolated from each other wafer segment. Referring now also to FIG. 5, therein is schematically depicted a laser dicing head 500, in operative placement relative to a section of the assembly of printed circuit board 300 with the identified wafer segments mounted thereon. As more clearly depicted in the isolated section of FIG. 5A, the solder balls 502 may provide some small degree of separation between the wafer section 202*b* and the underlying surface of printed circuit board 300. The exact magnitude of the spacing may vary, depending on the type of solder ball mechanisms used. For example, conventional solder ball technology will typically include balls within the range of from approximately 0.15 mm to approximately 0.50 mm, prior to partial reflowing of the solder. Some solder ball technologies include a central core, such as a copper sphere, that does not reflow when heated, but remains intact to provide some uniformity of spacing relative to the underlying substrate. Such cores, when present, are often on the order of 0.10 to 0.20 mm in diameter. In many cases, use of a solder paste will result in a relatively narrower space between an underlying substrate and the attached integrated circuit. In most cases, the distance between the lower surface of a wafer segment and the upper surface of the underlying substrate will be approximately 0.20 to 0.40 mm.

While laser dicing of semiconductor wafers, and equipment for performing such dicing, were each well-known prior to the teachings of the present disclosure, those conventional techniques are believed to have been applied only to dicing individual wafers, and not to a wafer mounted to a substrate.

With conventional techniques, a particular surface, such as the film described earlier herein, is chosen in relation to a laser that will be used, such that the film is not susceptible to cutting by the laser.

In accordance with the present inventive methods, however, the dicing will be accomplished after mounting to the substrate, such as the example of the described printed circuit board 300. In such an application, the wafer segments will have been previously separated from the supporting film in order to allow the mounting to the substrate. Accordingly, with the current techniques, the laser will be selected and controlled such that the depth of cut is sufficient to singulate each die site but to avoid substantial damage to the upper substrate surface. It has been found that a pulsed green laser, operating at a wavelength of approximately 532 nm, and a frequency of approximately 20 kHz, and a pulse rate of approximately 30 ns is suitable for the necessary operations. An example of a suitable laser is a frequency doubled, diode-pumped semiconductor laser, such as a Nd:YAG laser. With this type of laser, a pulse rate between 10-30 kHz, and a pulse width between 15-40 ns should be suitable for many implementations of the techniques described herein. Additionally, operating the laser at a power of approximately 9 W has been found suitable for dicing wafer segments while leaving a lower substrate intact. In at least some implementations, other types of lasers may advantageously be used. For example, non-frequency-doubled diode-pumped IR lasers having a much longer wavelength, for example of approximately 1064 nm. may be used. Such lasers may have a power range extending up to 200 W, with a pulse frequency in the range of 10-50 kHz, and a longer pulse width, for example up to approximately 100 ms. Thus, each wafer segment may be cut along the streets between die sites after mounting of each segment to a supporting substrate.

It is possible that other types of systems for dicing the wafer segments after mounting to a substrate may be utilized. It will be preferred, however, to use a system that offers the advantage of applying minimal mechanical strain to the wafer segment, so as to avoid, for example, strain such as might be exerted by a wafer saw. One other advantage of laser dicing includes the ability to make a relatively narrow cut, for example on the order of 30 to 50 microns. In some applications, this may allow for placing semiconductor die sites closer to one another on the wafer, in other words, reducing the dimension of the streets between die sites. This offers the advantages of potentially enabling the forming of more die sites on a given semiconductor wafer, thereby improving the maximum yield of the wafer. Additionally, when the die sites are of solar cells, then utilizing the techniques described herein, this increased density may be conveyed to the mounted solar cells to increase the number of the solar cells that may be placed within a given surface area, thereby improving the power density for a given size of substrate. Thus, the use of laser dicing of the wafer fragments, both at the time of separating the wafer into segments for simplified handling, and also for post-mounting singulation, facilitates greater density of manufacture of the cells on the wafer; and also greater density in placement on a printed circuit board or other substrate.

Many modifications and variations may be made in the techniques and structures described and illustrated herein, without departing from the spirit and scope of the present invention. For example, in addition to the numerous options and alternatives already discussed, many different types of placement equipment and surface mount technology may be utilized. Additionally, in addition to operations as discussed above, the currently-described methods are applicable to mounting wafer segments that may be packaged, shipped, or otherwise handled prior to assembly into a final product. Such packaging or other interim placement merely represents a temporal delay in the performing of the invention as otherwise described above. Accordingly, the present invention should be clearly understood to be limited only by the scope of the claims and the equivalents thereof.

We claim:

1. A method of forming an electronic assembly, comprising the acts of:
    securing a semiconductor wafer segment comprising a plurality of die sites to a substrate including electrical contacts; and
    subsequently, physically isolating at least one selected die site of the wafer segment from each adjacent die site, while leaving the substrate intact;
    wherein the act of securing establishes at least one permanent electrical connection between the plurality of die sites and the electrical contacts.

2. The method of claim 1, wherein the act of securing a semiconductor wafer segment to a substrate is performed, at least in part, through a solder reflow process.

3. The method of claim 1, wherein the act of physically isolating at least one selected die site is performed by laser dicing of said wafer segment.

4. A method of forming an electronic assembly, comprising the acts of:
    providing a semiconductor wafer segment, the wafer segment comprising a plurality of die sites;
    placing said semiconductor wafer segment in contact with a substrate including electrical contacts, and in registration with a reference on the substrate such that each die site of the semiconductor wafer segment is in operable registration with a mounting site on the substrate, such placement performed at least in part by a placement device operably associated with a vision system;
    bonding the semiconductor wafer segment to the substrate; and
    after said bonding, singulating each die site of the semiconductor wafer segment from each adjacent die site, while leaving the substrate intact;
    wherein the act of bonding establishes at least one permanent electrical connection between the plurality of die sites and the mounting sites.

5. The method of claim 4, wherein the semiconductor wafer is bonded to the substrate through use of solder.

6. The method of claim 5, wherein the wafer segment comprises an array of solder balls at each die site, and wherein the act of bonding the semiconductor wafer segment to the substrate comprises reflowing said solder balls.

7. The method of claim 6, wherein said solder balls comprise a non-solder-based core.

8. The method of claim 4, where said die are singulated through laser-dicing.

9. The method of claim 4, where said die are singulated through laser-dicing, performed through use of a diode-pumped semiconductor laser.

10. A method of forming a solar cell array, comprising the acts of:
    providing a semiconductor wafer segment having a plurality of individual solar cell die sites formed thereon, each solar cell die site comprising a plurality of solder pads;
    applying a solder material to a plurality of solder pads on a substrate including electrical contacts, said solder pads at least in part defining a plurality of solar cell mounting sites on the substrate;

placing said semiconductor wafer segment in contact with the substrate with said solar cell die sites in registration with said mounting sites on said substrate;

reflowing said solder to secure the semiconductor wafer segment to the substrate; and laser dicing the semiconductor wafer segment to physically isolate each solar cell die site of said semiconductor wafer segment;

wherein the act of reflowing establishes at least one permanent electrical connection between the plurality of solar cell die sites and the plurality of solar cell mounting sites.

11. The method of claim 10, wherein the act of laser dicing the semiconductor wafer segment is performed through use of a frequency-doubled, diode pumped semiconductor laser.

12. The method of claim 11, wherein said laser is a Nd:YAG laser.

* * * * *